United States Patent
Tang et al.

(10) Patent No.: US 12,295,163 B2
(45) Date of Patent: May 6, 2025

(54) FORMATION OF GATE STACKS COMPRISING A THRESHOLD VOLTAGE TUNING LAYER

(71) Applicant: ASM IP HOLDING B.V., Almere (NL)

(72) Inventors: Fu Tang, Gilbert, AZ (US); Eric James Shero, Phoenix, AZ (US); Gejian Zhao, Tempe, AZ (US); Eric Jen Cheng Liu, Tempe, AZ (US)

(73) Assignee: ASM IP Holding B.V., Almere (NL)

( * ) Notice: Subject to any disclaimer, the term of this patent is extended or adjusted under 35 U.S.C. 154(b) by 467 days.

(21) Appl. No.: 17/660,389

(22) Filed: Apr. 22, 2022

(65) Prior Publication Data
US 2023/0197796 A1 Jun. 22, 2023

Related U.S. Application Data

(60) Provisional application No. 63/265,547, filed on Dec. 16, 2021.

(51) Int. Cl.
H10D 64/01 (2025.01)
H01L 21/28 (2006.01)

(52) U.S. Cl.
CPC ....... H10D 64/01 (2025.01); H01L 21/28088 (2013.01)

(58) Field of Classification Search
None
See application file for complete search history.

(56) References Cited

U.S. PATENT DOCUMENTS

| | | |
|---|---|---|
| 2001/0024387 A1 | 9/2001 | Raaijmakers et al. |
| 2003/0049942 A1 | 3/2003 | Haukka et al. |
| 2003/0072975 A1 | 4/2003 | Shero et al. |
| 2004/0104439 A1 | 6/2004 | Haukka et al. |
| 2005/0075510 A1 | 4/2005 | Meiere et al. |
| 2005/0214458 A1 | 9/2005 | Meiere |
| 2006/0062910 A1 | 3/2006 | Meiere |
| 2006/0216932 A1 | 9/2006 | Kumar et al. |
| 2007/0001231 A1* | 1/2007 | Currie ........... H01L 29/7833 257/E29.151 |

(Continued)

FOREIGN PATENT DOCUMENTS

| | | |
|---|---|---|
| CN | 101511773 A | 8/2009 |
| CN | 104853855 B | 7/2020 |

(Continued)

*Primary Examiner* — Hsien Ming Lee
(74) *Attorney, Agent, or Firm* — Snell & Wilmer L.L.P.

(57) ABSTRACT

Threshold voltage (Vt) tuning layers may be sensitive to etching by reactants used to deposit overlying gate material, such as metal nitride. Methods for depositing Vt tuning layers are provided. In some embodiments Vt tuning layers may comprise a Vt tuning material in a neutral matrix. In some embodiments, processes for reducing or eliminating the etching of Vt tuning layers by halide reactants are described. In some embodiments a Vt tuning layer, such as a metal oxide layer, is treated by a nitridation process following deposition and prior to subsequent deposition of a metal nitride capping layer. In some embodiments an etch-protective layer, such as a NbO layer, is deposited over a Vt tuning layer prior to deposition of an overlying metal nitride layer.

15 Claims, 9 Drawing Sheets

(56) References Cited

U.S. PATENT DOCUMENTS

| | | | |
|---|---|---|---|
| 2007/0069401 A1* | 3/2007 | Kakehata | C23C 14/5853 |
| | | | 257/E27.113 |
| 2007/0254488 A1 | 11/2007 | Huotari et al. | |
| 2008/0032062 A1 | 2/2008 | Meiere | |
| 2009/0203222 A1 | 8/2009 | Dussarrat et al. | |
| 2009/0315093 A1 | 12/2009 | Li et al. | |
| 2010/0099264 A1 | 4/2010 | Elers | |
| 2011/0115026 A1* | 5/2011 | Jagannathan | H01L 29/66651 |
| | | | 257/411 |
| 2011/0198736 A1 | 8/2011 | Shero et al. | |
| 2011/0275215 A1 | 11/2011 | Gatineau et al. | |
| 2012/0178224 A1 | 7/2012 | Yamazaki | |
| 2012/0178249 A1 | 7/2012 | Yamazaki | |
| 2012/0187396 A1 | 7/2012 | Yamazaki et al. | |
| 2013/0011557 A1 | 1/2013 | Färm et al. | |
| 2013/0228775 A1 | 9/2013 | Noda et al. | |
| 2014/0106071 A1 | 4/2014 | Lansalot-Matras et al. | |
| 2014/0141542 A1 | 5/2014 | Kang et al. | |
| 2014/0154837 A1 | 6/2014 | Yamazaki | |
| 2014/0273510 A1 | 9/2014 | Chen et al. | |
| 2015/0179774 A1 | 6/2015 | Yamazaki et al. | |
| 2015/0340505 A1 | 11/2015 | Yamazaki et al. | |
| 2015/0361553 A1 | 12/2015 | Murakawa | |
| 2016/0155759 A1 | 6/2016 | Yamazaki et al. | |
| 2016/0251756 A1 | 9/2016 | Lansalot-Matras et al. | |
| 2016/0284854 A1 | 9/2016 | Okazaki et al. | |
| 2016/0376704 A1 | 12/2016 | Raisanen et al. | |
| 2017/0117141 A1 | 4/2017 | Zhu et al. | |
| 2017/0309732 A1 | 10/2017 | Yamazaki et al. | |
| 2018/0163312 A1 | 6/2018 | Blomberg et al. | |
| 2019/0139783 A1 | 5/2019 | Yamazaki et al. | |
| 2019/0348280 A1* | 11/2019 | Wu | H01L 21/0274 |
| 2019/0348515 A1 | 11/2019 | Li et al. | |
| 2020/0135471 A1 | 4/2020 | Lin et al. | |
| 2021/0040130 A1 | 2/2021 | Lee et al. | |
| 2021/0300955 A1 | 9/2021 | Park et al. | |
| 2021/0313262 A1* | 10/2021 | Fu | H01L 21/76877 |
| 2022/0231124 A1* | 7/2022 | Lee | H01L 29/775 |

FOREIGN PATENT DOCUMENTS

| | | |
|---|---|---|
| EP | 1425785 A2 | 6/2004 |
| JP | 2014199416 A | 10/2014 |
| JP | 2014199913 A | 10/2014 |
| JP | 2021504962 A | 2/2021 |
| KR | 20040087310 A | 10/2004 |
| KR | 20040094602 A | 11/2004 |
| KR | 20140013972 A | 2/2014 |
| KR | 20160108305 A | 9/2016 |
| KR | 20190128558 A | 11/2019 |
| KR | 20200022009 A | 3/2020 |
| TW | 200532047 A | 10/2005 |
| TW | 200829714 A | 7/2008 |
| TW | 201708233 A | 3/2017 |
| TW | 201736388 A | 10/2017 |
| TW | 201819394 A | 6/2018 |
| TW | 201829435 A | 8/2018 |
| TW | 202124767 A | 7/2021 |
| WO | 2004008827 A2 | 1/2004 |
| WO | 2020208458 A1 | 10/2020 |
| WO | 2021130598 A1 | 7/2021 |
| WO | 2021130600 A1 | 7/2021 |
| WO | 2021171136 A1 | 9/2021 |
| WO | 2021186297 A1 | 9/2021 |
| WO | 2022038450 A1 | 2/2022 |
| WO | 2022038453 A1 | 2/2022 |
| WO | 2022038456 A1 | 2/2022 |
| WO | 2022043824 A1 | 3/2022 |
| WO | 2022049459 A1 | 3/2022 |

\* cited by examiner

FORMATION OF GATE STACKS COMPRISING A THRESHOLD VOLTAGE TUNING LAYER

INCORPORATION BY REFERENCE TO ANY PRIORITY APPLICATIONS

This application claims the benefit of U.S. Provisional Application No. 63/265,547, filed Dec. 16, 2021, titled "PROCESSES FOR REDUCING ETCHING OF METAL OXIDE VOLTAGE TUNING LAYERS," the entirety of which is incorporated herein by reference.

BACKGROUND

Field

The present disclosure generally relates to the field of semiconductor device manufacturing and, more particularly, to processes for forming threshold voltage (Vt) tuning layers and protecting metal oxide layers from etching during subsequent processing. For example, metal oxide layers and post-deposition nitridation may inhibit the etching of metal oxide threshold voltage tuning layers by metal halide reactants.

Background

The deposition of threshold voltage ("Vt") tuning layers can be used to meet the electrical requirements of multi-Vt layer structures in the field of semiconductor fabrication. In the formation of a gate stack, a metal nitride capping layer may be deposited over a high dielectric constant material ("high-k material"), such as $HfO_2$ and $ZrO_2$, followed by thermal annealing. To shift the Vt of these devices, a second metal oxide layer compatible with the metal nitride layer and with the desired Vt shift characteristics may be deposited on the high-k material prior to deposition of the metal nitride. However, many of the electrically and chemically suitable metal oxide layers used in Vt tuning can be etched by the halide containing reactants commonly used to form the metal nitride layer. This etching leads to reduced deposition process control and poses a challenge to the fabrication of multi-Vt layer structures and devices.

SUMMARY

In some aspects, processes for forming a stack of thin films on a substrate in a reaction chamber are provided. In some embodiments, the processes comprise depositing a first metal oxide layer on a substrate comprising a high-k material and then forming a protective layer directly over the metal oxide layer. In some embodiments the first metal oxide layer is a Vt tuning metal oxide layer. A metal nitride layer is subsequently deposited on the protective layer using a metal halide reactant. The protective layer may serve to protect the first metal oxide from etching by the metal halide reactant and thus may be considered an etch-protective layer.

In some embodiments, the metal nitride layer is formed by contacting a substrate with a first metal halide reactant and contacting the substrate with a second nitrogen reactant. In some embodiments, the metal of the metal halide comprises molybdenum (Mo), titanium (Ti), or aluminum (Al). In some embodiments the metal nitride is TiN and the metal halide is $TiCl_4$. In some embodiments the metal nitride is MON and the metal halide is $MoCl_5$.

In some embodiments, the high-k material comprises $HfO_2$. In some embodiments, the first metal oxide comprises lanthanum oxide, gallium oxide, vanadium oxide, molybdenum oxide, zinc oxide, indium oxide, tungsten oxide or niobium oxide.

In some embodiments, the etch-protective layer is formed by treating the first metal oxide layer to convert at least a portion of the first metal oxide layer to an etch-protective layer. In some embodiments the first metal oxide layer is treated with a nitrogen reactant.

In some embodiments the nitrogen reactant used to treat the first metal oxide to form the etch-protective layer comprises nitrogen atoms, nitrogen radicals or nitrogen plasma. In some embodiments the nitrogen reactant comprises $NH_3$. In some embodiments the nitrogen reactant comprises plasma generated from a compound comprising nitrogen, such as a plasma generated in gas comprising $N_2H_2$, $N_2$ or $N_2/H_2$. In some embodiments the plasma is a remote or direct plasma.

In some embodiments the first metal oxide layer comprises lanthanum oxide, gallium oxide, aluminum oxide, vanadium oxide, molybdenum oxide, zinc oxide, indium oxide, tungsten oxide or niobium oxide. These oxides may also be written as LaO, GaO, AlO, NbO, VO, MoO, ZnO, InO and WO, and unless indicated otherwise, the oxides may have any stoichiometry. In some embodiments the first metal oxide layer comprises $La_yO_x$, $Ga_yO_x$, $Al_yO_x$, $Nb_yO_x$, $V_yO_x$, $Mo_yO_x$, $Zn_yO_x$, $In_yO_x$, or $W_yO_x$, wherein y is between 1 and 5 and x is between 1 and 10. In some embodiments treating the first metal oxide layer with a nitrogen reactant forms an etch protective layer. In some embodiments, the etch protective layer is a portion of the metal oxide in which nitrogen is incorporated. In some embodiments, the etch protective layer comprises GaN, LaN, NbN, AlN, VN, MON, ZnN, InN, or WN.

In some embodiments, an etch-protective layer is formed by depositing an etch-protective metal oxide layer directly over the first metal oxide layer. The etch-protective metal oxide layer may comprise, for example, niobium oxide or aluminum oxide. Niobium oxide and aluminum oxide may also be written as NbO or AlO herein, and unless indicated otherwise the oxides are not limited to a specific stoichiometry. In some embodiments the etch protective layer comprises $Al_yO_x$ or $Nb_yO_x$, wherein y is between 1 and 5 and x is between 1 and 10. In some embodiments the etch-protective metal oxide layer may be a niobium oxide layer.

In some embodiments, the process further comprises contacting the etch-protective metal oxide layer with a nitrogen reactant prior to depositing the metal nitride layer. In some embodiments the nitrogen reactant is $NH_3$. In some embodiments, the nitrogen reactant comprises a plasma generated in a gas comprising $N_2$ or a gas comprising $N_2$ and $H_2$. In some embodiments, the plasma is a remote plasma or a direct plasma.

In some embodiments, the process for forming a stack of thin films on a substrate comprises providing a substrate comprising a layer of high-k material in a reaction chamber, depositing a first metal oxide layer on the substrate, then depositing an etch-protective metal oxide layer over the first metal oxide layer, the etch-protective layer comprising NbO or AlO, and then depositing a metal nitride layer on the etch-protective metal oxide layer by a vapor deposition process using a vapor-phase metal halide reactant.

In some embodiments, the first metal oxide layer comprises GaO or LaO. In some embodiments, the vapor phase metal halide reactant comprises $TiCl_4$. In some embodiments, the metal nitride layer comprises TiN, AlN, MON, or TiAlN. In some embodiments, one or more of the layers is deposited by a Chemical Vapor Deposition process or an Atomic Layer Deposition process.

In some embodiments, the etch-protective metal oxide layer has a thickness of less than about 10 Å. In some embodiments the stack of thin films is a gate stack in an integrated circuit device. The high-k material may serve as a gate oxide in the gate stack. The metal oxide layer may be a threshold voltage (Vt) tuning oxide layer. The metal nitride layer may form a capping layer over the Vt tuning metal oxide layer and serve as a metal gate material.

In other aspects, processes for forming a gate stack comprising a threshold voltage (Vt) tuning layer on a substrate in a reaction chamber are described. In some embodiments, the processes comprise providing a substrate comprising a layer of high-k material in the reaction chamber, and then depositing a Vt tuning layer comprising a Vt tuning material in a neutral matrix over the layer of high-k material. In some embodiments, an etch protective layer may subsequently be deposited on the Vt tuning layer. In some embodiments, a metal nitride layer may subsequently be deposited on the etch protective layer, for example by a vapor deposition process using a vapor phase metal halide reactant.

In some embodiments, the Vt tuning material comprises Ga, La or Hf. In some embodiments, the Vt tuning material comprises $Ga_yO_x$, $Ga_yN$, $Ga_yC_x$, $Ga_y(ON)_x$, or $Ga_y(CN)_x$, wherein y is between 1 and 5 and x is between 1 and 10. In some embodiments, the neutral matrix comprises Nb, In, Zn or Al. In some embodiments, the neutral matrix comprises $Nb_yO_x$, $Nb_yN_x$, $Nb_yC_x$, $In_yO_x$, $In_yN_x$, $In_yC_x$, $Zn_yO_x$, $Zn_yC_x$, $Zn_yN_x$, $Al_yO_x$, $Al_yC_x$, or $Al_yN_x$, wherein y is between 1 and 5 and x is between 1 and 10.

In some embodiments, the Vt tuning layer comprises a Vt tuning material, such as a Vt tuning metal, metal oxide, metal nitride or metal carbide, in a neutral matrix with a corresponding neutral metal, metal oxide, metal nitride or metal carbide. In some embodiments, the Vt tuning metal and neutral matrix are co-deposited on the substrate.

In some embodiments, depositing a Vt tuning layer comprises contacting the substrate comprising a layer of high-k material with a vapor phase neutral matrix precursor and a vapor phase Vt tuning material precursor. In some embodiments, the substrate is contacted with the neutral matrix precursor prior to contacting the substrate with the Vt tuning material precursor. In some embodiments, the neutral matrix precursor comprises at least one of Nb, In, Zn, or Al. In some embodiments, the Vt tuning material precursor comprises at least one of La, Hf, or Ga. In some embodiments, the process further comprises contacting the neutral matrix precursor and the Vt tuning material precursor with an oxygen-containing, nitrogen-containing or carbon-containing reactant to form corresponding oxides, nitrides or carbides. In some embodiments, the neutral matrix precursor and/or the Vt tuning material precursor are contacted with an oxidant to form a Vt tuning oxide and/or a neutral matrix oxide material. In some embodiments, the oxidant comprises $O_2$. In some embodiments, the growth rate of a Vt tuning oxide deposited using $O_2$ is lower than the growth rate using other oxidants such as water and ozone. In some embodiments, the neutral matrix precursor and/or the Vt tuning material precursor are contacted with a reactant comprising nitrogen to form a Vt tuning nitride and/or a neutral matrix nitride material. In some embodiments, the neutral matrix precursor and/or the Vt tuning material precursor are contacted with a reactant comprising carbon to form a Vt tuning carbide and/or a neutral matrix carbide material. In some embodiments, the neutral matrix comprises NbO and the Vt tuning material comprises GaO.

DETAILED DESCRIPTION

Figure 1:
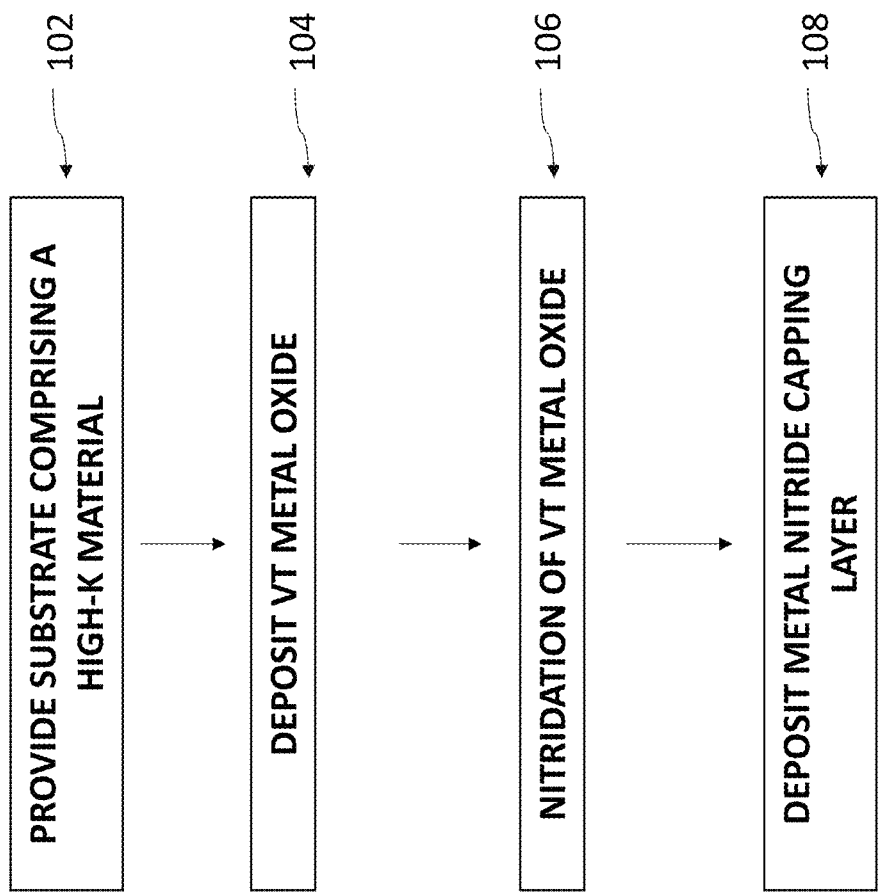
FIG. 1 is a flow chart generally illustrating a process of forming a layer of thin films comprising a layering order in accordance with some embodiments of the present disclosure.

In the field of semiconductor device fabrication, the threshold voltage (Vt) of a gate stack can be tuned by including a metal oxide layer or other voltage tuning material in the gate stack. The ability to tune the Vt allows, for example, for the formation of multi-Vt devices. Tuning can be achieved by forming a gate stack of thin films of different materials, including a high-k material, a voltage tuning material, such as a metal oxide, that creates a desired Vt shift (referred to herein as a "Vt tuning material", "Vt tuning metal oxide" or "tuning metal oxide"), and a metal nitride layer. Not all metal oxides are suitable for Vt tuning, as the Vt tuning material needs to have the electrical properties to create the desired Vt shifts while also being compatible with other materials, such as with an overlying metal nitride layer. Vt tuning materials, such as Vt tuning metal oxides, that have these characteristics are sometimes susceptible to etching by the reactants used to deposit an overlying metal nitride capping layer. In particular, Vt tuning metal oxides and other Vt tuning materials may be susceptible to halide etching when vapor phase metal halide precursors are used to deposit an overlying metal nitride. To reduce unwanted etching, these Vt tuning metal oxides and other Vt tuning materials can be protected by the formation of etch-protective layers. For example, in some embodiments post-deposition nitridation of the tuning metal oxide can be used to reduce the etching associated with subsequent metal nitride deposition using metal halide reactants. In some embodiments, an etch-protective metal oxide that is itself etch resistant can be deposited over the Vt tuning metal layer to reduce the etching associated with subsequent metal nitride deposition using halide reactants. In some embodiments, a protective metal oxide that is etch resistant can be deposited over the Vt tuning layer and then subjected to nitridation prior to deposition of the overlying metal nitride using halide reactants. In some embodiments a Vt tuning material that is itself resistant to etching may be used.

While described primarily in the context of a gate stack in an integrated circuit device comprising a high-k material that may serve as a gate oxide in the gate stack, a metal oxide layer that may serve as a threshold voltage (Vt) tuning layer, and a metal nitride layer that may form a capping layer over the Vt tuning metal oxide layer and serve as a metal gate material, the methods and materials described herein are not limited to this context. The processes may be applied to other contexts in which deposition of a Vt layer is desired, and other contexts in which protection of a metal oxide from etching by a halide reactant in a subsequent processing step is desired.

To achieve a desired Vt in a gate stack, Vt tuning layers having specific thicknesses and electrical properties may be desirable. Different Vt tuning materials may have different thickness sensitivities. For example, GaOx may have a thickness sensitivity of greater than 50 mV/A. Thus, different thicknesses may be used to obtain a desired Vt shift and in some situations, desirable Vt values may be obtained using ultra-thin Vt tuning layers, for instance GaOx Vt tuning layers with a thickness of 1 Å or less may be used to achieve a target Vt tuning level of about 100 mV. However, it may be advantageous to deposit thicker Vt tuning layers in some contexts. In some embodiments, desirable Vt tuning may be achieved through the deposition of Vt tuning layers comprising a Vt tuning material diluted in a neutral matrix. Vt tuning layers comprising a Vt tuning material diluted in a neutral matrix may be used to lower the thickness sensitivity of Vt tuning and allow for the use of thicker layers, e.g. 5 Å thick Vt tuning layers, to achieve desirable Vt characteristics. In some embodiments, the deposition of thicker Vt tuning layers comprising a Vt tuning material in a neutral matrix may allow for improved layer uniformity relative to thinner Vt tuning layers comprising only a Vt tuning material. In some embodiments, Vt tuning layers comprising a Vt tuning material in a neutral matrix may have lower sensitivity to etching relative to Vt tuning layers comprising only a Vt tuning material, such as etching caused by the deposition of metal nitrides using halide reactants, as described above. In some embodiments, Vt tuning layers may be formed by co-depositing Vt tuning materials along with neutral matrix materials. In some embodiments, Vt tuning layers comprising a Vt tuning material in a neutral matrix may be deposited on a high-k substrate in a process for forming a gate stack as described herein.

In some embodiments, a substrate is provided comprising a high-k material, such as $HfO_2$, $HfSiO_4$, $La_2O_3$, $Y_2O_3$, $TiO_2$, or $LaAlO_3$. A metal oxide is deposited over the high-k material. In some embodiments, in the formation of a gate stack, a compatible Vt tuning layer is deposited over the high-k material. In some embodiments the Vt tuning layer has a thickness from about 1 Å to 20 Å.

In some embodiments, the Vt tuning layer is a metal oxide. In some embodiments the metal oxide layer comprises or consists of lanthanum oxide, gallium oxide, hafnium oxide or niobium oxide. These oxides may also be written as LaO, GaO, HfO, and NbO, and unless indicated otherwise, the oxides may have any stoichiometry. In some embodiments the metal oxide may comprise $La_yO_x$, $Ga_yO_x$, $Nb_yO_x$, or $Hf_yO_x$, wherein y is between 1 and 5 and x is between 1 and 10. In some embodiments the Vt tuning metal oxide may consist of $La_yO_x$, $Ga_yO_x$, $Hf_yO_x$, or $Nb_yO_x$, wherein y is between 1 and 5 and x is between 1 and 10. In some embodiments, a Vt tuning metal oxide layer may be deposited via a vapor deposition process, for example, a Chemical Vapor Deposition (CVD) process or an Atomic Layer Deposition (ALD) process.

In some embodiments, the Vt tuning layer comprises a Vt tuning material in a neutral matrix. In some embodiments, the Vt tuning layer comprises a Vt tuning material in a matrix comprising a corresponding neutral material. For example, the Vt tuning layer may comprise a Vt tuning oxide, such as GaO, in a matrix of a corresponding neutral oxide, such as NbO, InO, ZnO or AlO. In some embodiments, the Vt tuning material may comprise GaO in a neutral matrix of NbO.

In some embodiments, the Vt tuning material may comprise Ga, La or Hf. In some embodiments, the Vt tuning material may comprise gallium oxide, gallium nitride, gallium carbide, gallium oxynitride, or gallium cyanide. These materials may also be written as GaO, GaN, GaC, GaON, GaCN, and unless indicated otherwise, these materials may have any stoichiometry. For example, in some embodiments, the Vt tuning material may comprise $Ga_yO_x$, $Ga_yN_x$, $Ga_yC_x$, $Ga_y(ON)_x$, $Ga_y(CN)_x$, wherein y is between 1 and 5 and x is between 1 and 10.

In some embodiments, the neutral matrix may comprise a neutral matrix material. In some embodiments, a neutral matrix material is any material that doesn't cause a substantial Vt shift. In some embodiments, a neutral matrix material may comprise Nb, In, Zn or Al. In some embodiments, a neutral matrix material may comprise niobium oxide, niobium nitride, niobium carbide, indium oxide, indium nitride, indium carbide, zinc oxide, zinc carbide, zinc nitride, aluminum oxide, aluminum carbide, or aluminum nitride. These materials may be written as NbO, NbN, NbC, InO, InN, InC, ZnO, ZnC, ZnN, AlO, AlC, or AlN, and unless indicated otherwise, these materials may have any stoichiometry. In some embodiments, the neutral matrix material may comprise $Nb_yO_x$, $Nb_yN_x$, $Nb_yC_x$, $In_yO_x$, $In_yN_x$, $In_yC_x$, $Zn_yO_x$, $Zn_yC_x$, $Zn_yN_x$, $Al_yO_x$, $Al_yC_x$, or $Al_yN_x$, wherein y is between 1 and 5 and x is between 1 and 10.

In some embodiments, a Vt tuning layer comprising a Vt tuning material in a neutral matrix may be deposited via a vapor deposition process, for example, a Chemical Vapor Deposition (CVD) process or an Atomic Layer Deposition (ALD) process. In some embodiments, a Vt tuning material and a neutral matrix material may be co-deposited on a substrate. In some embodiments, co-depositing a Vt tuning material and a neutral matrix material comprises contacting the substrate first with a neutral matrix material precursor and then with a Vt tuning material precursor. In some embodiments, co-depositing a Vt tuning material and a neutral matrix material comprises contacting a substrate with a Vt tuning material precursor and a neutral matrix material precursor simultaneously.

In some embodiments, co-depositing a Vt tuning material and a neutral matrix material lowers the amount of the Vt tuning material deposited in each deposition cycle. In some embodiments, lowering the amount of the Vt tuning material dilutes the Vt tuning material in the Vt tuning layer, such that the amount of Vt tuning material is reduced in a Vt tuning layer of a given thickness relative to a Vt tuning layer in which the Vt tuning material is undiluted. In some embodiments, diluting the Vt tuning material lowers the sensitivity of the Vt tuning characteristics to the thickness of the layer, allowing for the deposition of a thicker Vt tuning layer to achieve desired Vt characteristics.

In some embodiments, depositing a Vt tuning material layer in a neutral matrix further comprises contacting the adsorbed Vt tuning material precursor and the adsorbed neutral matrix precursor with one or more of an oxygen, nitrogen or carbon-containing reactant in order to form the desired Vt tuning material and/or desired neutral matrix material.

In some embodiments, the adsorbed Vt tuning material precursor and the adsorbed neutral matrix precursor are contacted with an oxidant, e.g., an oxygen containing reactant to form a Vt tuning oxide material in a neutral matrix material comprising the corresponding oxide. In some embodiments, an oxygen containing reactant comprises $O_2$. In some embodiments, contacting the adsorbed Vt tuning material precursor and the adsorbed neutral matrix precursor with an oxygen containing reactant forms a diluted Vt tuning metal oxide in a neutral matrix material. In some embodiments, the Vt tuning metal oxide comprises GaO. In some embodiments, the formed neutral matrix material comprises NbO, InO, ZnO, and/or AlO. In some embodiments the Vt tuning metal oxide is GaO and the neutral matrix material is NbO. In some embodiments the GaO Vt tuning metal oxide and the NbO neutral matrix material are co-deposited by contacting a substrate comprising a high-k material layer with a first with a neutral matrix material precursor comprising Nb and subsequently contacting the substrate with a Vt tuning material precursor comprising Ga, such that neutral matrix material precursor species and Vt tuning material precursor species adsorb on the substrate surface. The neutral metal matrix material precursor species and Vt tuning material precursor species adsorbed on the substrate are converted to their respective oxides by contacting the substrate with an oxygen containing reactant. In some embodiments the oxygen containing reactant is $O_2$.

In some embodiments, one or both of the Vt tuning material precursor and the neutral matrix precursor are contacted with the substrate one, two or more distinct times in a cyclic vapor deposition process. Excess Vt tuning material precursor and/or the neutral matrix precursor may be removed from the reaction chamber between contacting steps. For example, in some embodiments, each deposition cycle may comprise contacting the substrate with the neutral matrix precursor for a desired period of time, removing excess neutral matrix precursor from the vicinity of the substrate, contacting the substrate with the Vt tuning material precursor and removing excess Vt tuning material precursor. The substrate may also be contacted with an oxygen, nitrogen or carbon-containing reactant in one or more deposition cycles in order to form the desired Vt tuning material and neutral matrix material. One, two, three or more deposition cycles may be carried out to deposit a Vt tuning layer of the desired thickness. In some embodiments, the cycles are carried out sequentially, without contacting the substrate with other reactants during the deposition process. In some embodiments, from 1 to 1000, from 1 to 100, from 1 to 50, from 1 to 25, from 1 to 15, or from 1 to 10 deposition cycles are carried out sequentially.

In some embodiments, the growth rate of the Vt tuning material layer or Vt metal oxide layer is about 0.8 Å per cycle. In some embodiments, the growth rate of the Vt tuning material layer or Vt tuning metal oxide layer is about 0.7 Å/cycle, about 0.6 Å/cycle, about 0.5 Å/cycle, about 0.4 Å/cycle, about 0.2 Å/cycle, about 0.1 Å/cycle, less than 0.1 Å, or any value or range between those values.

In some embodiments, depositing a Vt tuning material layer in a neutral matrix may lower the Vt thickness sensitivity. In some embodiments, the Vt thickness sensitivity, or the change in Vt per unit of thickness, may be about 10 mV/Å. In some embodiments, the Vt thickness sensitivity may be about 10 mV/Å, 11 mV/Å, 12 mV/Å, 13 mV/Å, 14 mV/Å, 15 mV/Å, or any value or range of values therebetween.

In some embodiments, after deposition, a Vt tuning layer, such as a Vt tuning metal oxide layer, is treated to provide increased etch-resistance prior to deposition of an overlying metal nitride layer. In some embodiments, a metal nitride capping layer is deposited over a Vt tuning layer by a vapor deposition process, such as an ALD or CVD process. In some embodiments the metal nitride deposition process utilizes a vapor phase metal halide reactant and a nitrogen reactant. For example, a TiN layer can be deposited by a vapor deposition process using a titanium halide such as $TiCl_4$ and a nitrogen reactant. However, other metal nitrides may be used in some embodiments, such as TiAlN, MON, TaN, or WN, and these metal nitrides maybe deposited using a corresponding metal halide reactant, such as $MoCl_5$, $TaF_5$, $WF_6$, or $WCl_5$.

In some embodiments, treatment of a Vt tuning layer, such as a metal oxide layer, comprises exposing the Vt tuning layer to a nitrogen reactant. At least a portion of the tuning metal oxide layer is nitrided, forming an etch resistant protective layer. In some embodiments nitrogen is incorporated into at least a portion of the Vt tuning metal oxide layer. However, the desired tuning of the threshold voltage is maintained.

In some embodiments after depositing the Vt tuning layer, an etch-protective metal oxide layer is deposited over the Vt tuning layer prior to deposition of the overlying metal nitride layer. In some embodiments, the etch-protective metal oxide layer is a niobium oxide layer or an aluminum oxide layer. Niobium oxide and aluminum oxide may also be written as NbO or AlO herein, and unless indicated otherwise the oxides are not limited to a specific stoichiometry. In some embodiments the etch protective layer comprises $Al_yO_x$ or $Nb_yO_x$, wherein y is between 1 and 5 and x is between 1 and 10. The etch-protective metal oxide layer may be deposited, for example, by ALD or CVD. In some embodiments, the etch-protective metal oxide layer is deposited to a thickness of less than about 10 Å. In some embodiments the desired tuning of the threshold voltage is maintained despite the deposition of a second metal oxide layer.

In some embodiments, the etch-protective metal oxide layer is itself treated by nitridation prior to the deposition of the metal nitride layer. In some embodiments, treatment comprises exposing the etch-protective metal oxide to a nitrogen reactant.

As mentioned above, after formation of the etch-protective layer, a capping layer of metal nitride may be deposited using a metal halide reactant, for example by an ALD or CVD process. In some embodiments the metal nitride capping layer is deposited directly over and contacting the treated Vt tuning metal oxide layer or the etch-protective metal oxide layer. In some embodiments the etch-protective treatment or layer reduces etching of the Vt tuning metal oxide layer during deposition of the overlying metal nitride layer relative to an unprotected Vt tuning metal oxide layer. In some embodiments less than 25%, less than 15%, less than 10%, less than 5%, less than 3%, or less than 1% of the Vt tuning metal oxide layer is lost to etching during deposition of the overlying metal nitride capping layer. In some embodiments, less than 2 Å, less than 1.5 Å, less than 1 Å, less than 0.5 Å or less than 0.1 Å of the Vt tuning metal oxide layer is etched during subsequent deposition of the metal nitride capping layer.

The reactants employed in the vapor deposition and treatment processes described herein may be solid, liquid or gaseous materials under standard conditions (room temperature and atmospheric pressure), provided that the precursors are in vapor phase before they are conducted into the reaction chamber and contacted with the substrate surface. "Pulsing" a vaporized reactant means that the reactant vapor is conducted into the reaction chamber to contact the substrate for a limited period of time. Typically, the pulsing time is from about 0.05 to 10 seconds. However, depending on the substrate type and its surface area, the pulsing time may be even higher than 10 seconds. Pulsing times can be on the order of minutes in some cases. The optimum pulsing time can be determined by the skilled artisan based on the particular circumstances.

Examples of suitable reactors that may be used include commercially available ALD and CVD reactors, as well as other kinds of reactors capable of vapor-deposition, including reactors equipped with appropriate equipment and means for pulsing the precursors and reactants.

In some embodiments the nitridation process is carried out in the same reaction chamber in which the Vt tuning metal oxide is deposited. In some embodiments the nitridation process is carried out in a different reaction chamber. The nitridation process can optionally be carried out in a reactor or reaction space connected to a cluster tool in which other reactions, such as deposition of the Vt tuning metal oxide layer and/or deposition of the overlying metal nitride layer take place.

In some embodiments the deposition of an etch-protective metal oxide layer over the Vt tuning layer is carried out in the same reaction chamber in which the Vt tuning layer is deposited. In some embodiments the deposition of the etch-protective layer is carried out in a different reaction chamber. The etch-protective layer deposition process can optionally be carried out in a reactor or reaction space connected to a cluster tool in which other reactions, such as deposition of the Vt tuning metal oxide layer and/or deposition of the overlying metal nitride layer take place.

In some embodiments the deposition of the overlying metal nitride capping layer using a metal halide reactant is carried out in the same reaction chamber as the nitridation and/or deposition of the etch-protective oxide layer. In some embodiments the deposition of the overlying metal nitride layer is carried out in a different reaction chamber. In some embodiments, deposition of the metal nitride capping layer is carried out in a reaction chamber connected to a cluster tool in which other reactions, such as deposition of the Vt tuning layer, treatment of the Vt tuning layer and/or etch-protective oxide layer deposition take place.

Nitridation of Vt Tuning Metal Oxide Layer

As discussed above, in some embodiments a Vt tuning layer, such as a Vt tuning layer comprising metal oxide, is treated by nitridation after deposition to protect the layer from etching during subsequent deposition of an overlying layer, such as a metal nitride layer, using one or more halide reactants. In some embodiments nitridation comprises contacting the Vt tuning metal oxide layer with a nitrogen reactant. The nitrogen reactant may comprise atomic nitrogen, nitrogen radicals, nitrogen plasma, or combinations thereof. In some embodiments the nitrogen reactant may further comprise atomic hydrogen, hydrogen radicals, hydrogen plasma, or combinations thereof. In some embodiments, the nitrogen reactant may be $NH_3$ or $N_2H_4$. In some embodiments the nitrogen reactant may comprise plasma formed from $N_2$. In some embodiments the nitrogen reactant may comprise plasma formed from one or more compounds having both N and H, such as $NH_3$, a mixture of $N_2/H_2$, from $N_2H_2$, or other precursors having an N—H bond. In some embodiments the nitrogen reactant may additionally comprise a noble gas, for example argon. In some embodiments, the plasma may be a remote plasma. In some embodiments the nitrogen plasma may be a direct plasma.

In some embodiments, the metal oxide layer may be exposed to an $N_2/H_2$ plasma. In some embodiments the nitrogen reactant may be a plasma formed, at least in part, from gas comprising $H_2$ and $N_2$, where the $H_2$ and $N_2$ are provided at a flow ratio $(H_2/2_2)$ from about 20:1 to about 1:20, preferably from about 10:1 to about 1:10, more preferably from about 5:1 to about 1:5 and most preferably from about 2:1 to about 4:1, and in some cases 1:1. In some embodiments the $N_2/H_2$ plasma is generated remotely and delivered to the reaction space in one or more pulses.

In some embodiments the plasma is generated at a plasma power of about 50 W to 500 W.

In some embodiments, the vapor phase nitrogen reactant is provided in one or more pulses into the reaction chamber where it contacts the metal oxide surface. The nitrogen reactant may be provided by itself or may be provided with the aid of an inert carrier gas.

Typically, the pulsing time for the nitrogen reactant is from about 0.1 seconds to 15 minutes. However, depending on the substrate type and its surface area, the pulsing time may be even higher than 15 minutes. Pulsing times can be on the order of minutes in some cases. The optimum pulsing time can be determined by the skilled artisan based on the particular circumstances.

In some embodiments the vapor phase nitrogen reactant is contacted with the substrate for one period of time. For example, in some embodiments the substrate comprising the Vt tuning metal oxide layer may be contacted with a nitrogen plasma for a period of about 1 to 15 minutes, about 1 to 10 minutes, about 1 to 4 minutes, about 1 to 3 minutes, about 1 to 2 minutes or about 1 minute. Thus, in some embodiments the nitrogen reactant is provided to the reaction chamber in a single pulse. In some embodiments a single pulse of nitrogen reactant of from about 1 to 15 minutes, about 1 to 10 minutes, about 1 to 4 minutes, about 1 to 3 minutes, about 1 to 2 minutes or about 1 minute.

In some embodiments the vapor phase nitrogen reactant is contacted with the substrate two or more distinct times. The nitrogen reactant may be removed from the reaction chamber between contacting steps. For example, the substrate may be contacted with the nitrogen reactant in a plurality of treatment cycles. In some embodiments each treatment cycle may comprise contacting the substrate with the nitrogen reactant for a desired period of time and then removing the reactant from the vicinity of the substrate. In some embodiments a treatment cycle comprises providing a pulse of nitrogen reactant to the reaction space and removing the excess nitrogen reactant and reaction by-products from the reaction space, such as by purging. One, two, three or more nitridation treatment cycles may be carried out to achieve the desired level of nitridation of the Vt tuning metal oxide layer. In some embodiments the nitridation treatment cycles are carried out sequentially, without contacting the substrate with other reactants during the nitridation process. In some embodiments from 1 to 1000, from 1 to 100, from 1 to 50, from 1 to 25, from 1 to 15, or from 1 to 10 treatment cycles are carried out sequentially. In some embodiments in each treatment cycle the substrate is contacted with a nitrogen plasma for a period of about 1 to 15 minutes, about 1 to 10 minutes, about 1 to 4 minutes, about 1 to 3 minutes, about 1 to 2 minutes or about 1 minute. In some embodiments each treatment cycle comprises a pulse of nitrogen reactant of from about 1 to 15 minutes, about 1 to 10 minutes, about 1 to 4 minutes, about 1 to 3 minutes, about 1 to 2 minutes or about 1 minute.

After contacting the substrate for a desired period of time, excess nitrogen reactant and reaction byproducts, if any, are removed from the reaction chamber. In some embodiments, excess nitrogen reactant is removed from the reaction chamber by purging, for example with the aid of an inert purge gas such as hydrogen. In some embodiments the nitrogen reactant may be removed by turning off the plasma power while continuing to flow a nitrogen gas such as $N_2$ or a mixture of $N_2$ and $H_2$. In some embodiments nitrogen reactants are removed from the vicinity of the surface of the substrate by moving the substrate. For example, the substrate may be moved from a first reaction space containing the nitrogen reactant to a different reaction space that does not contain nitrogen reactant. In some embodiments a treatment cycle comprises a purge of at least one minute.

The nitrogen reactant employed in the vapor deposition processes may be solid, liquid or gaseous materials under standard conditions (room temperature and atmospheric pressure), provided that the reactants are in vapor phase before they are conducted into the reaction chamber and contacted with the substrate surface.

Before starting the nitridation of the Vt tuning metal oxide layer, the substrate is typically heated to a suitable treatment temperature. The treatment temperature may vary, depending, for example, on the nature of the tuning oxide layer, the nitrogen reactant, pressure, flow rate, arrangement of the reactor, etc. In some embodiments, exposure of the Vt tuning metal oxide to a nitrogen reagent occurs at a treatment temperature of from about 200° C. to about 650° C. In some embodiments the treatment temperature is about 300° C. to about 500° C. In some embodiments the treatment temperature is about 400° C. to about 450° C.

The mass flow rate of the nitrogen reactant can also be determined by the skilled artisan. In some embodiments, the flow rate of the nitrogen reactant is preferably between about 1 and 10 slm without limitation.

During the nitridation of the Vt tuning metal oxide layer the pressure in the reaction chamber is typically from about 0.01 to about 80 mbar, more preferably from about 1 to about 10 mbar. However, in some cases the pressure will be higher or lower than this range, as can be determined by the skilled artisan given the particular circumstances.

In some embodiments, the Vt tuning metal oxide layer is deposited via a thermal ALD process. In some embodiments, a gallium oxide Vt tuning layer is treated with one or more vapor phase nitrogen reactants. In some embodiments, a niobium oxide Vt tuning layer is treated with one or more vapor-phase nitrogen reactants.

In some embodiments the etch-protective nitridation treatment reduces etching of the Vt tuning metal oxide layer during deposition of the overlying metal nitride relative to an unprotected Vt tuning metal oxide layer, such as during deposition of a TiN layer using $TiCl_4$. In some embodiments less than 25%, less than 15%, less than 10%, less than 5%, less than 3%, or less than 1% of the Vt tuning metal oxide layer is lost to etching during deposition of the overlying metal nitride capping layer. In some embodiments, less than 2 Å, less than 1.5 Å, less than 1 Å, less than 0.5 Å or less than 0.1 Å of the Vt tuning metal oxide layer is etched during subsequent deposition of the metal nitride capping layer.

FIG. 1 is an exemplary illustration of a process flow for in which a Vt tuning metal oxide layer is protected from etching by post-deposition nitridation. In some embodiments, a substrate comprising a high-k material, such as $HfO_2$, is provided in a reaction chamber at step 102. A Vt tuning metal oxide layer, such as a GaO, HfO, NbO, or LaO layer is deposited over the high-k material at step 104. The Vt tuning metal oxide layer may be deposited by a vapor deposition process, such as a CVD or ALD process. To protect this Vt tuning metal oxide layer from undesired etching, the Vt tuning metal oxide layer is subject to post-deposition nitridation at step 106. The nitridation converts at least a portion of the Vt tuning metal oxide layer to a nitrided layer that is resistant to etching by halide reactants. As discussed above, in some embodiments the Vt tuning metal oxide layer is exposed to a nitrogen reactant comprising a nitrogen plasma. In some embodiments the nitrogen plasma is formed in a mixture of $N_2$ and $H_2$ gas.

In some embodiments, after the protective nitridation in step 106, a metal nitride capping layer can be deposited over the nitride Vt tuning metal oxide layer at step 108. The metal nitride capping layer can be formed by a vapor deposition process utilizing a metal halide reactant and a nitrogen reactant. In some embodiments, the metal of the metal halide reactant can be at least one of molybdenum (Mo), titanium (Ti), or aluminum (Al). In some embodiments the metal halide may comprise one of $TiCl_4$ or $MoCl_5$. In some embodiments the metal nitride may be TiN. The TiN may be deposited using $TiCl_4$.

In some embodiments, the deposition of the metal nitride capping layer 108 may be performed by, for instance, a chemical vapor deposition (CVD) process or an atomic layer deposition (ALD) process.

In some embodiments, the first Vt tuning metal oxide layer can be GaO, the etch-protective layer can be formed by nitridation of the GaO with nitrogen plasma, and a TiN capping layer can be deposited directly over the nitrided Vt tuning metal oxide layer by vapor deposition using $TiCl_4$ as the titanium precursor. The metal halide used to form the second metal nitride layer can be $TiCl_4$, the amount of GaO lost to etching from the $TiCl_4$ can be below 55%. In some embodiments, when the Vt tuning metal oxide layer can be NbO, the etch-protective layer can be formed with $NH_3$ and $N_2H_2$, and $TiCl_4$ can be the metal halide used to from the second metal nitride layer, the amount of NbO lost to etching can be reduced to less than 1%.

Figure 2:
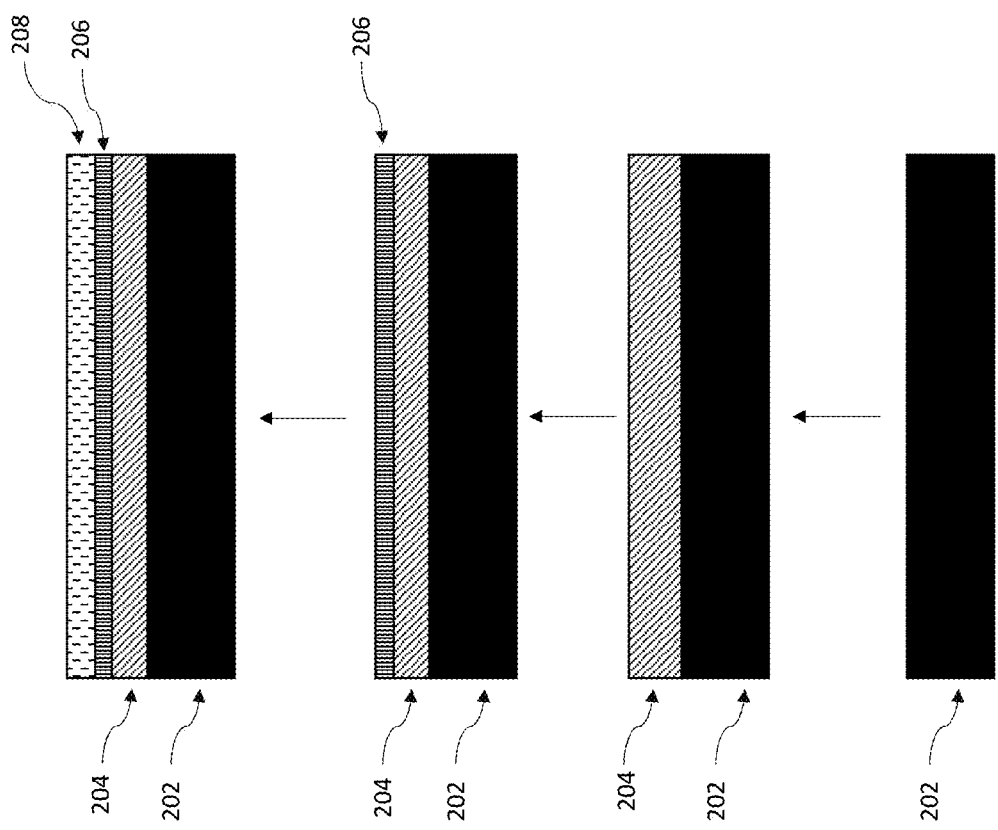
FIG. 2 illustrates a schematic cross-sectional view of a process of forming thin films according to embodiments of the present disclosure.

FIG. 2 is an exemplary schematic cross-sectional illustration of the thin films deposited by the process of FIG. 1. In some embodiments, a substrate comprising a high-k material 202, such as $HfO_2$, is provided. Referring to FIG. 2, in some embodiments, a first Vt tuning metal oxide layer 204 is deposited over the high-k material 202. As discussed above, the Vt tuning metal oxide layer may comprise, for example, $La_yO_x$, $Ga_yO_x$, $Al_yO_x$, $Nb_yO_x$, $V_yO_x$, $Mo_yO_x$, $Zn_yO_x$, $In_yO_x$, or $W_yO_x$, wherein y is between 1 and 5 and x is between 1 and 10.

The Vt tuning metal oxide layer 204 is subject to nitridation, such that a portion of layer 204 is converted to an etch-resistant nitrided layer 206. The nitrided layer 206 can serve as an etch-protective layer.

In some embodiments, after the formation of the etch-protective layer 206, a metal nitride capping layer 208 can be deposited over the etch-protective layer 206. The metal nitride capping layer may be formed by a vapor deposition process utilizing a metal halide reactant and a nitrogen reactant, such as an ALD or CVD process. In some embodiments, a TiN layer is deposited using TiCl$_4$ as a titanium source. The etch-protective layer 206 may protect the Vt tuning metal oxide layer 204 from etching during deposition of the metal nitride capping layer 208.

Metal Oxide Etch-Protective Layer Over A Vt Tuning Layer

As discussed above, in some embodiments after deposition of a Vt tuning layer, such as a Vt tuning layer comprising a metal oxide, an etch-protective metal oxide layer is deposited on the Vt tuning layer to protect the Vt tuning layer from etching during subsequent deposition of a metal nitride capping layer using halide reactants. In some embodiments, a NbO etch-protective layer is deposited on a Vt tuning layer. In some embodiments an AlO etch-protective layer is deposited on a Vt tuning layer. The protective metal oxide layer may be deposited, for example, by an ALD or CVD process. In some embodiments the protective metal oxide layer is deposited to a thickness of above about 0 to 10 Å, or about 0.1 to 0 to 10 Å. After deposition of the protective metal oxide layer, a metal nitride capping layer may be deposited by a vapor deposition process using a metal halide reactant.

In some embodiments a NbO etch-protective layer is deposited on a GaO Vt tuning metal oxide layer. In some embodiments, a NbO etch-protective layer is deposited on a LaO Vt tuning metal oxide layer.

In some embodiments, the protective metal oxide layer is subject to nitridation after deposition and prior to deposition of the overlying metal nitride capping layer. Nitridation may comprise treating the protective metal oxide layer, such as a NbO layer, with a nitrogen reactant as described above.

In some embodiments the etch-protective metal oxide layer reduces etching of the Vt tuning layer during deposition of the overlying metal nitride relative to an unprotected Vt tuning layer, such as during deposition of a TiN layer using TiCl$_4$. In some embodiments less than 25%, less than 15%, less than 10%, less than 5%, less than 3%, or less than 1% of the Vt tuning layer is lost to etching during deposition of the overlying metal nitride capping layer. In some embodiments, less than 2 Å, less than 1.5 Å, less than 1 Å, less than 0.5 Å or less than 0.1 Å of the Vt tuning layer is etched during subsequent deposition of the metal nitride capping layer.

Figure 3:
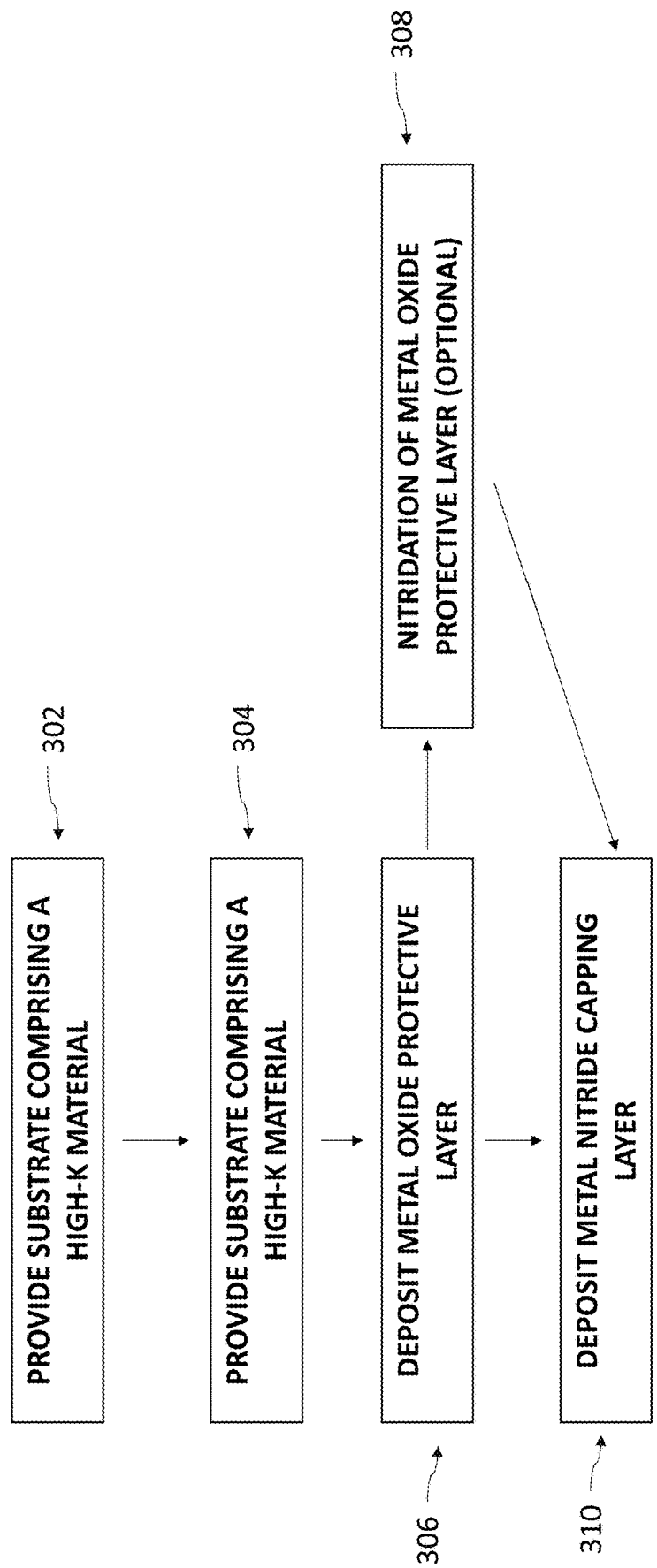
FIG. 3 illustrates a schematic cross-sectional view of a process of forming thin films according to embodiments of the present disclosure.

FIG. 3 is an exemplary illustration of a process flow in which an etch-protective oxide layer is utilized to protect a Vt tuning layer from etching during deposition of an overlying metal nitride capping layer using halide reactants. In some embodiments, a substrate comprising a high-k material, such as HfO$_2$, is provided in a reaction chamber at step 302. A Vt tuning layer, such as a La$_y$O$_x$, Ga$_y$O$_x$, Al$_y$O$_x$, Nb$_y$O$_x$, V$_y$O$_x$, Mo$_y$O$_x$, Zn$_y$O$_x$, In$_y$O$_x$, or W$_y$O$_x$, wherein y is between 1 and 5 and x is between 1 and 10, layer is deposited over the high-k material at step 304. The Vt tuning layer may be deposited by a vapor deposition process, such as a CVD or ALD process. To protect this Vt tuning layer from undesired etching, an etch-protective layer of metal oxide, such as NbO or AlO, can be deposited on the Vt tuning layer at step 306. The etch-protective metal oxide layer may be deposited by a vapor deposition process, for example, by an ALD or CVD process.

In some embodiments, after the etch-protective metal oxide layer is deposited in step 306, a metal nitride capping layer can be deposited over the etch-protective metal oxide layer at step 310. The metal nitride capping layer can be formed by a vapor deposition process utilizing a metal halide reactant and a nitrogen reactant. In some embodiments, the metal of the metal halide reactant can be at least one of Mo, Ti, or Al. In some embodiments the metal halide may comprise TiCl$_4$ or MoCl$_5$. In some embodiments the metal nitride capping layer may be a TiN layer. The TiN may be deposited using TiCl$_4$.

In some embodiments, the deposition of the metal nitride capping layer 310 may be performed by, for instance, a chemical vapor deposition (CVD) process or an atomic layer deposition (ALD) process.

In some embodiments, the first Vt tuning layer can comprise GaO, the etch-protective layer comprises NbO, and a TiN capping layer can be deposited directly over the NbO etch-protective layer by vapor deposition using TiCl$_4$ as the titanium precursor. The amount of GaO lost to etching from the TiCl$_4$ can be below 50%. In some embodiments, the amount of GaO lost to etching can be reduced to less than 1%.

In some embodiments, prior to the deposition of the metal nitride capping layer the etch-protective metal oxide layer can optionally undergo a nitridation treatment as described above, in which the etch-protective layer can be contacted with a nitrogen reactant at step 308. This nitridation treatment creates a nitrided portion of the etch-protective layer that can further serve to reduce etching of the Vt tuning layer.

Figure 4:
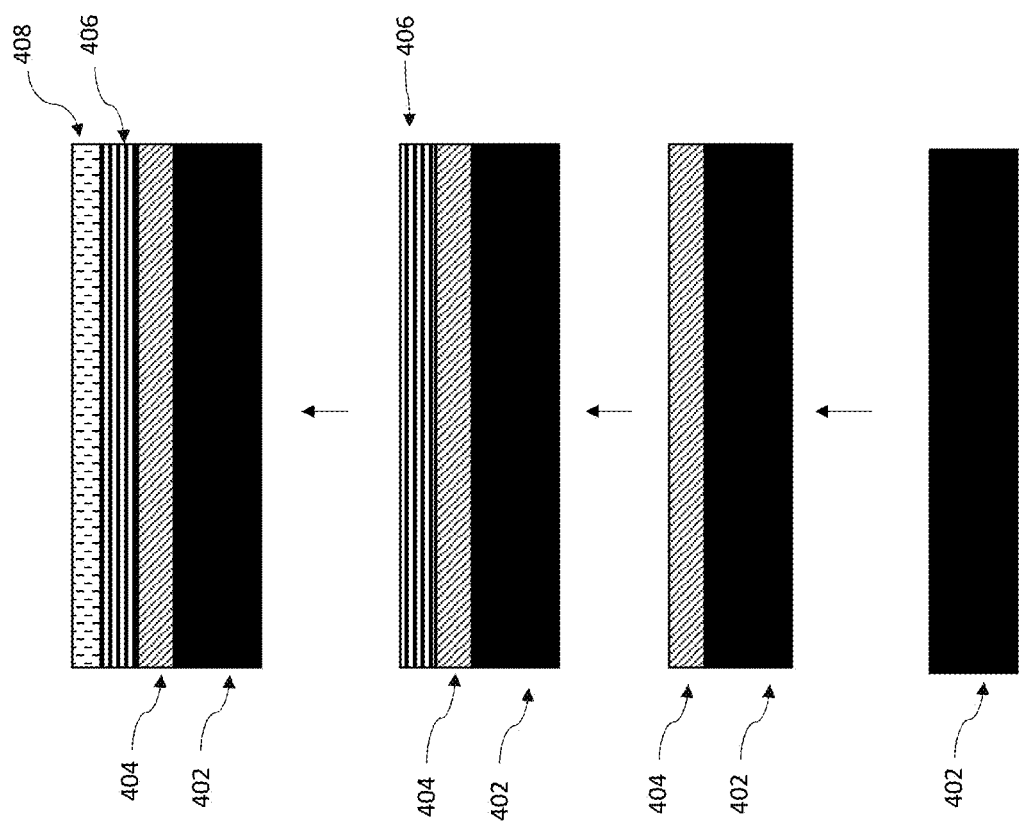
FIG. 4 illustrates a schematic cross-sectional view of a process of forming thin films according to embodiments of the present disclosure.

FIG. 4 is an exemplary schematic cross-sectional illustration of the thin films deposited by the process of FIG. 3. In some embodiments, a substrate comprising a high-k material 402, such as HfO$_2$, is provided. Referring to FIG. 4, in some embodiments, a first Vt tuning metal oxide layer 404, such as a La$_y$O$_x$, Ga$_y$O$_x$, Al$_y$O$_x$, Nb$_y$O$_x$, V$_y$O$_x$, Mo$_y$O$_x$, Zn$_y$O$_x$, In$_y$O$_x$, or W$_y$O$_x$ layer, wherein y is between 1 and 5 and x is between 1 and 10, can be deposited on the substrate. Then, in some embodiments, a metal oxide etch-protective layer 406 can be deposited over the Vt tuning metal oxide layer. In some embodiments, the second metal oxide layer can be a NbO or AlO layer.

A metal nitride capping layer 408 can be subsequently deposited over the metal oxide etch protective layer 406. The metal nitride layer may be formed by a vapor deposition process utilizing a metal halide reactant and a nitrogen reactant. In some embodiments, the metal of the metal halide reactant can be Mo, Ti, or Al. In some embodiments the metal halide reactant may comprise on of TiCl$_4$ or MoCl$_5$. In some embodiments the metal nitride capping layer 408 comprises TiN deposited using TiCl$_4$. The metal oxide etch-protective layer 406 may reduce the etching of Vt tuning metal oxide layer 404 during deposition of the metal nitride capping layer 408. In some embodiments, the deposition of the metal nitride layer capping layer may be performed by, for instance, a chemical vapor deposition (CVD) process, an atomic layer deposition (ALD) process, or a furnace process.

Figure 5:
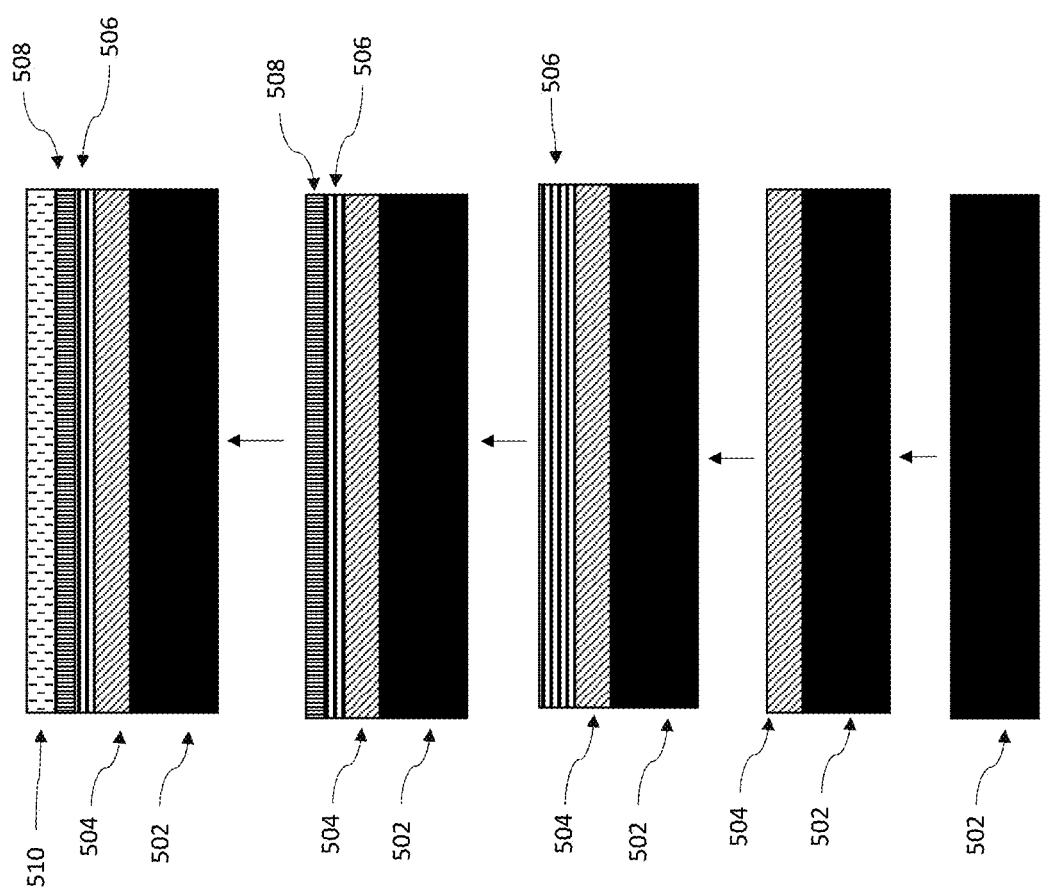
FIG. 5 is a flow chart generally illustrating a process of forming a layer of thin films comprising a layering order in accordance with some embodiments of the present disclosure.

FIG. 5 is an exemplary schematic cross-sectional illustration of the thin films deposited by the process of FIG. 3 in which the metal oxide etch-protective layer is subject to a nitridation process as described above. In some embodiments, a substrate comprising a high-k material 502, such as HfO$_2$, is provided. A first Vt tuning metal oxide layer 504, such as a La$_y$O$_x$, Ga$_y$O$_x$, Al$_y$O$_x$, Nb$_y$O$_x$, V$_y$O$_x$, Mo$_y$O$_x$, Zn$_y$O$_x$, In$_y$O$_x$, or W$_y$O$_x$ layer, wherein y is between 1 and 5 and x is between 1 and 10, is deposited on the substrate 502. Then a metal oxide etch-protective layer 510 can be deposited over the Vt tuning metal oxide layer. In some embodiments, the etch-protective metal oxide layer 506 can be a NbO or AlO layer.

As mentioned above, the etch-protective metal oxide layer can optionally undergo a nitridation treatment as described herein, in which the etch-protective layer can be contacted with a nitrogen reactant to form a nitrided portion 508 of the etch-protective layer 506 that can further serve to reduce etching of the Vt tuning metal oxide layer. The metal nitride capping layer 510 can be subsequently deposited over the nitrided portion 508 of the metal oxide etch protective layer 506.

Examples

Figure 6:
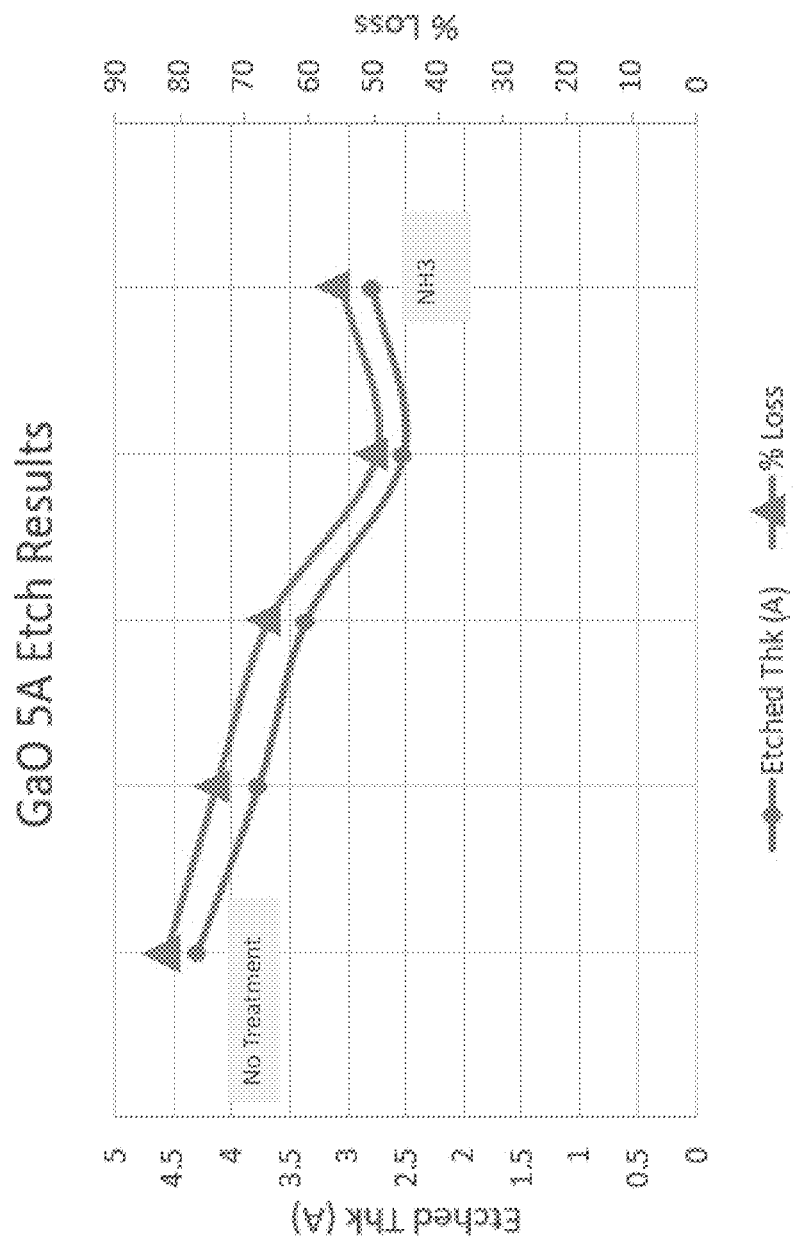
FIG. 6 illustrates the amount of GaO etched with and without nitridation prior to the formation of a TiN capping layer.

GaO and NbO layers of 5 nm were deposited on substrates. The GaO and NbO layers were subject to treatment by nitridation prior to deposition of TiN using $TiCl_4$. As illustrated in FIG. 6, deposition of TiN on an untreated GaO layer led to about an 80% loss of GaO, with a thickness loss of more than 4.5 Å. However, GaO etching was reduced to about a 55% loss (about 3 Å) by nitridation with 15 treatment cycles in which the GaO layer was contacted with $NH_3$ for one minute, followed by a one-minute purge.

Figure 7:
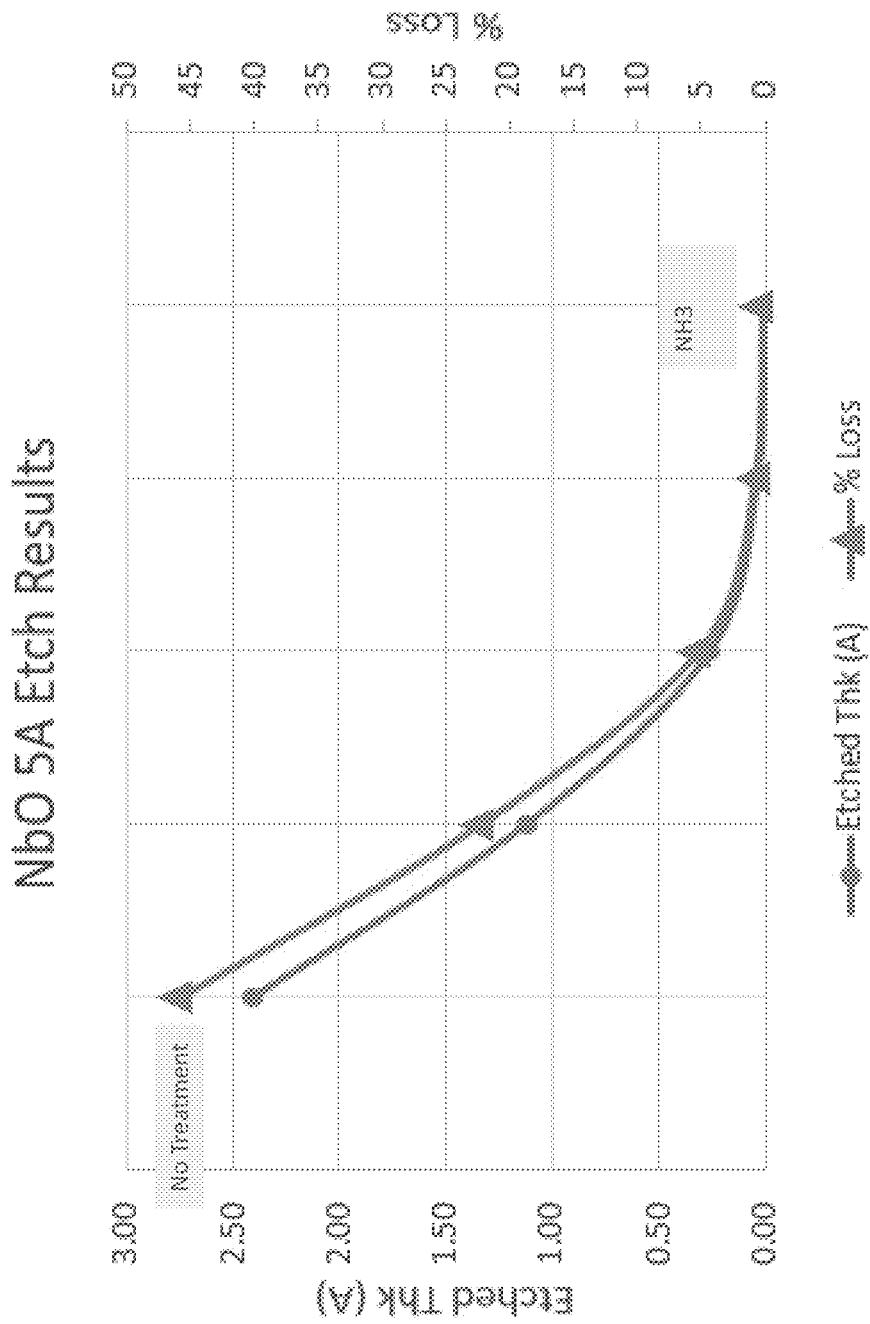
FIG. 7 illustrates the amount of NbO etched with and without nitridation prior to the formation of a TiN capping layer.

As illustrated in FIG. 7, NbO etching by $TiCl_4$ during deposition of TiN was reduced by treatment of the NbO layer with $NH_3$. Without the nitridation treatment, about 45% of the NbO was etched during the deposition of TiN, with a thickness loss of more than 2 Å. With the $NH_3$ treatment prior to the deposition of TiN using $TiCl_4$, almost no etching was observed, and less than 1% of the NbO was lost.

Figure 8:
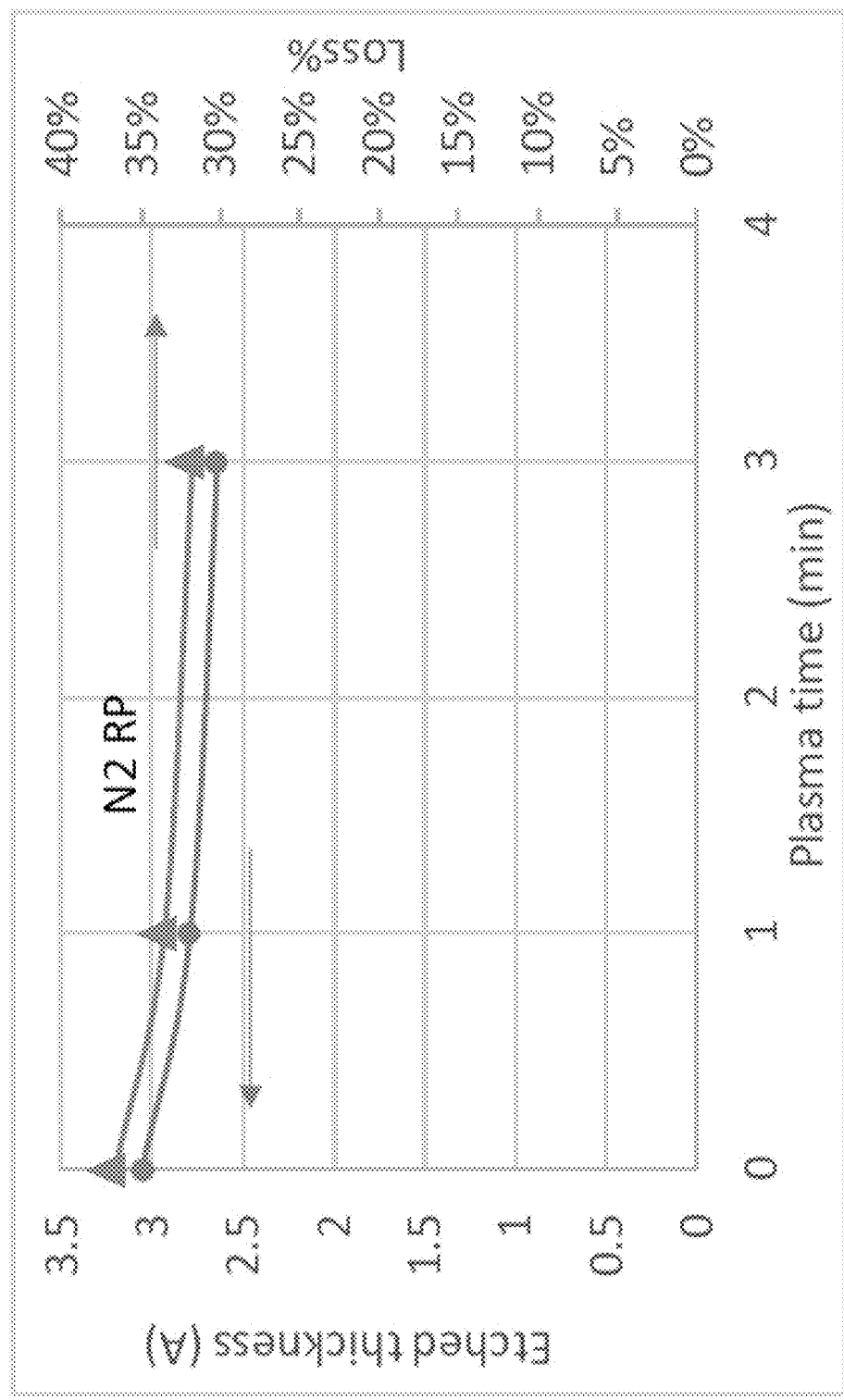
FIG. 8 illustrates the amount of Vt tuning oxide lost during etching when using an $N_2$ remote plasma as a nitride treatment.

As illustrated in FIG. 8, nitridation of a GaO layer by $N_2$ remote plasma treatment for 3 minutes reduced the loss of GaO by etching by $TiCl_4$ during TiN deposition by about 2.5%, with a corresponding decrease in the thickness that was etched. Treating the GaO layer with a $N_2$ remote plasma for 1 minute reduced the etching of GaO by somewhat less.

Figure 9:
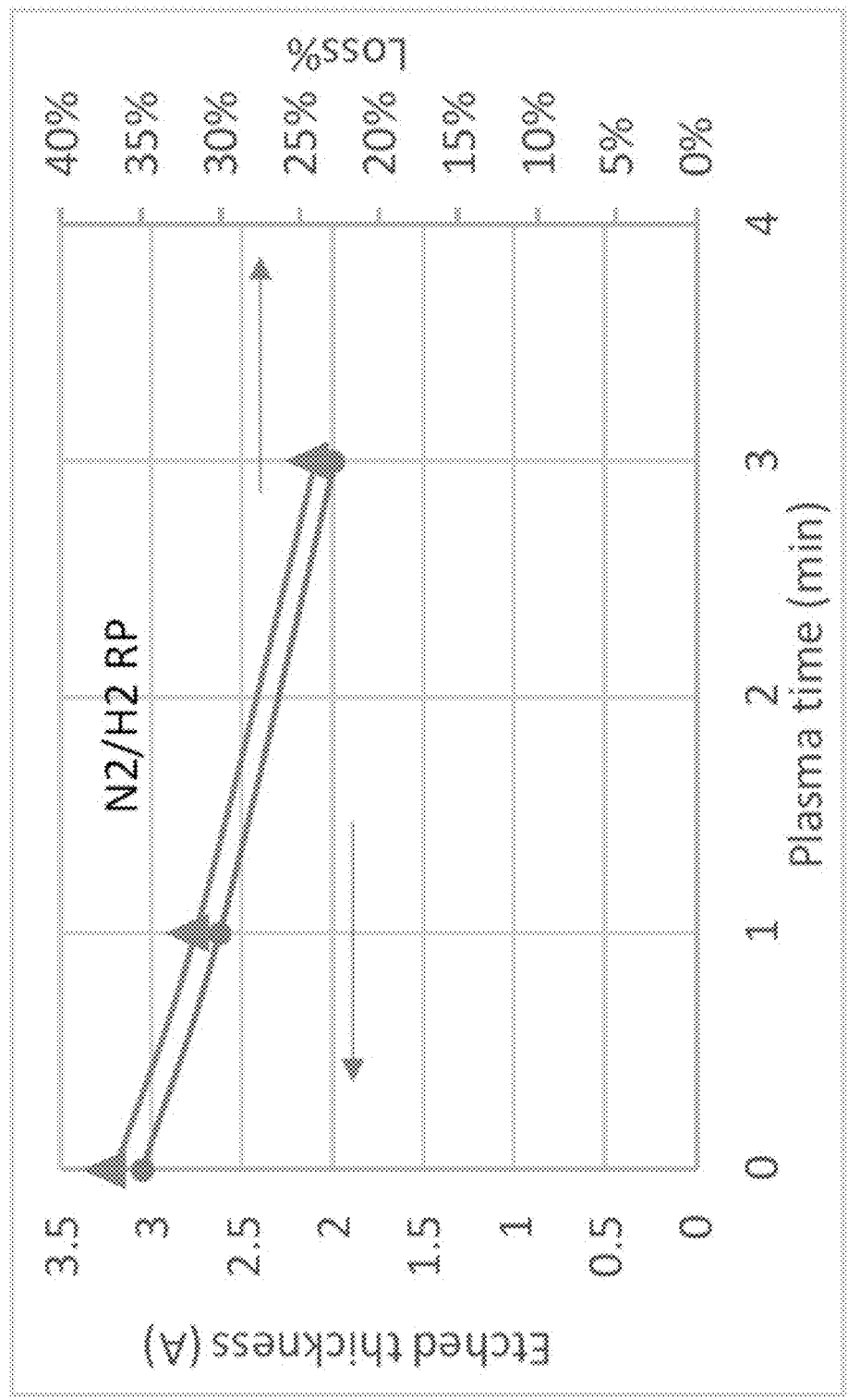
FIG. 9 illustrates the amount of Vt tuning oxide lost during etching when using an $N_2/H_2$ remote plasma as a nitride treatment.

As illustrated in FIG. 9, nitridation of a GaO layer by $N_2/H_2$ remote plasma treatment reduced loss of GaO following TiN deposition by 12%. Without treatment about 36% of the of the GaO was etched. Treating a GaO layer with a $N_2/H_2$ remote plasma for 1 minute reduced the amount of GaO etched to about 32.5%. Treating a GaO layer with a $N_2/H_2$ remote plasma for 3 minutes reduced the amount of GaO etched to about 23%

While various embodiments are discussed in the general contexts of the deposition of Vt tuning layers and the treatment of Vt oxide layers by nitridation prior to deposition of an overlying metal nitride film using a metal halide reactant, the skilled artisan will appreciate that the principles and advantages taught herein will have application to other contexts. Furthermore, while a number of processes are disclosed herein, one of ordinary skill in the art will recognize the utility of certain of the disclosed steps in the processes, even in the absence of some of the other disclosed steps, and similarly that subsequent, prior and intervening steps can be added.

What is claimed is:

1. A process for forming a gate stack comprising a threshold voltage (Vt) tuning metal oxide layer on a substrate in a reaction chamber comprising:
   providing a substrate comprising a layer of high-k material in the reaction chamber;
   depositing a Vt tuning metal oxide layer over the layer of high-k material;
   depositing an etch-protective metal oxide layer comprising NbO over the Vt tuning metal oxide layer; and
   depositing a metal nitride layer on the etch-protective metal oxide layer by a vapor deposition process using a vapor phase metal halide reactant.

2. The process of claim 1, wherein the Vt tuning metal oxide layer comprises $La_yO_x$, $Ga_yO_x$, $Al_yO_x$, $Nb_yO_x$, $V_yO_x$, $Mo_yO_x$, $Zn_yO_x$, $In_yO_x$, or $W_yO_x$, wherein y is between 1 and 5 and x is between 1 and 10.

3. The process of claim 1, wherein the metal nitride layer comprises TiN, AlN, MON, or TiAlN.

4. The process of claim 1, wherein the metal nitride layer is deposited by a Chemical Vapor Deposition process or an Atomic Layer Deposition process.

5. The process of claim 1, wherein the Vt tuning metal oxide layer comprises GaO or LaO, the metal nitride layer comprises TiN and the vapor phase metal halide reactant comprises $TiCl_4$.

6. A process for forming a gate stack comprising a threshold voltage (Vt) tuning material layer on a substrate in a reaction chamber comprising:
   providing a substrate comprising a layer of high-k material in the reaction chamber;
   depositing a Vt tuning layer comprising a Vt tuning material in a neutral matrix over the layer of high-k material; and
   depositing a metal nitride layer over the Vt tuning layer, wherein the Vt tuning material comprises Ga, La or Hf.

7. The process of claim 6, wherein the Vt tuning material comprises La or Hf.

8. The process of claim 6, wherein the Vt tuning material comprises $Ga_yO_x$, $Ga_yN$, $Ga_yC_x$, $Ga_y(ON)_x$, or $Ga_y(CN)_x$, wherein y is between 1 and 5 and x is between 1 and 10.

9. A process for forming a gate stack comprising a threshold voltage (Vt) tuning material layer on a substrate in a reaction chamber comprising:
   providing a substrate comprising a layer of high-k material in the reaction chamber;
   depositing a Vt tuning layer comprising a Vt tuning material in a neutral matrix over the layer of high-k material; and
   depositing a metal nitride layer over the Vt tuning layer, wherein the neutral matrix comprises Nb, In, Zn or Al.

10. A process for forming a gate stack comprising a threshold voltage (Vt) tuning material layer on a substrate in a reaction chamber comprising:
    providing a substrate comprising a layer of high-k material in the reaction chamber;
    depositing a Vt tuning layer comprising a Vt tuning material in a neutral matrix over the layer of high-k material; and
    depositing a metal nitride layer over the Vt tuning layer, wherein the neutral matrix comprises $Nb_yO_x$, $Nb_yN_x$, $Nb_yC_x$, $In_yO_x$, $In_yN_x$, $In_yC_x$, $Zn_yO_x$, $Zn_yC_x$, $Zn_yN_x$, $Al_yO_x$, $Al_yC_x$, or $Al_yN_x$, wherein y is between 1 and 5 and x is between 1 and 10.

11. A process for forming a gate stack comprising a threshold voltage (Vt) tuning material layer on a substrate in a reaction chamber comprising:
    providing a substrate comprising a layer of high-k material in the reaction chamber;
    depositing a Vt tuning layer comprising a Vt tuning material in a neutral matrix over the layer of high-k material; and
    depositing a metal nitride layer over the Vt tuning layer, wherein depositing the Vt tuning layer comprises a vapor deposition process comprising contacting the substrate with a vapor phase neutral matrix precursor and subsequently contacting the substrate with a vapor phase Vt tuning material precursor.

12. The process of claim 11, wherein the neutral matrix precursor comprises at least one of Nb, In, Zn, or Al.

13. The process of claim 11, wherein the Vt tuning material precursor comprises at least one of La, Hf, or Ga.

14. The process of claim 11, wherein the substrate is contacted with an oxygen-containing reactant comprising $O_2$.

15. The process of claim 14, wherein the Vt tuning material comprises GaO and the neutral matrix comprises NbO.

\* \* \* \* \*